United States Patent [19]

Ishijima

[11] Patent Number: 4,920,397
[45] Date of Patent: Apr. 24, 1990

[54] STRUCTURE OF COMPLEMENTARY FIELD EFFECT TRANSISTOR

[75] Inventor: Toshiyuki Ishijima, Tokyo, Japan

[73] Assignee: NEC Corporation, Tokyo, Japan

[21] Appl. No.: 173,478

[22] Filed: Mar. 25, 1988

[30] Foreign Application Priority Data

Mar. 26, 1987 [JP] Japan .................. 62-73241

[51] Int. Cl.⁵ .............................. H01L 27/02
[52] U.S. Cl. ..................... 357/42; 357/55; 357/23.4; 365/181; 365/182
[58] Field of Search .......... 357/42, 55, 23.4; 365/154, 181, 182

[56] References Cited

U.S. PATENT DOCUMENTS

| 4,566,025 | 1/1986 | Jastrzebski | 357/42 |
| 4,670,768 | 6/1987 | Sunami | 357/42 |
| 4,672,410 | 6/1987 | Miura | 357/55 |
| 4,740,826 | 4/1988 | Chatterjee | 357/42 |

FOREIGN PATENT DOCUMENTS

| 61-69165 | 4/1986 | Japan | 357/42 |
| 62-20366 | 1/1987 | Japan | 357/42 |

Primary Examiner—Andrew J. James
Assistant Examiner—Mark Prenty
Attorney, Agent, or Firm—Sughrue, Mion, Zinn, Macpeak & Seas

[57] ABSTRACT

For reduction in occupation area, there is provided a complementary field effect transistor consisting of a n-channel MIS type field effect transistor formed along a side wall of a p-type silicon substrate and a p-channel MIS type field effect transistor formed along a side wall of an n-type well in the p-type silicon substrate, and both of the side wall of the silicon substrate and the side wall of the n-type well define a groove where a conductive material is deposited to provide an interconnection between the n-type and p-type MIS type field effect transistors and another complementary field effect transistor.

11 Claims, 8 Drawing Sheets

PRIOR-ART

PRIOR-ART

STRUCTURE OF COMPLEMENTARY FIELD EFFECT TRANSISTOR

FIELD OF THE INVENTION

This invention relates to a complementary field effect transistor and, more particularly, to the structure of a complementary field effect transistor appropriate to a memory cell incorporated in the static type random access memory fabricated on a semiconductor substrate.

BACKGROUND OF THE INVENTION

FIG. 1 shows a typical example of a memory cell incorporated in a memory cell array of a static-type random access memory device. The memory cell is formed by a first series combination of a p-channel MOS type field effect transistor 1 and an n-channel MO type field effect transistor 2 coupled between a source of positive voltage Vdd and the ground, a second series combination of a p-channel MOS type field effect transistor 3 and an n-channel MOS type field effect transistor 4 coupled in parallel to the first series combination between the source of positive voltage Vdd and the ground, and two switching transistors 5 and 6 each formed by, for example, an n-channel MOS type field effect transistor. The first and second series combinations serve as two complementary MOS (metal-oxide-semiconductor) field effect transistors. First and second memory nodes 7 and 8 are provided between the p-channel MOS type field effect transistor 1 and the n-channel MOS type field effect transistor 2 and between the p-channel MOS type field effect transistor 3 and the n-channel MOS type field effect transistor 4, respectively. The first memory node 7 is coupled to gate electrodes of the p-channel MOS type field effect transistor 3 and the n-channel MOS type field effect transistor 4, and, on the other hand, the second memory node 8 is coupled to gate electrodes of the p-channel MOS type field effect transistor 1 and the n-channel MOS type field effect transistor 2. Between the first and second memory nodes 7 and 8 and a bit line pair consisting of two bit lines 9 and 10 are provided the switching transistors 5 and 6 which has respective gate electrodes commonly coupled to a word line 11. The memory cell thus arranged is capable of preserving a data bit of logic "0" level or logic "1" level depending upon complementary voltage levels on the bit line pair. Namely, when an address specified by an address signal is assigned to the memory cell, the word line 11 goes up to a positive high voltage level, then the switching transistors 5 and 6 turn on to provide conduction paths between the bit line pair and the first and second memory nodes 7 and 8. The complementary voltage levels propagate the conduction paths and reach the memory nodes 7 and 8. The complementary voltage levels at the memory nodes 7 and 8 allow or do not allow the respective complementary MOS field effect transistors to shift to the opposite states, respectively, thereby preserving a new data bit represented by the complementary voltage levels.

As described above, the memory cell is implemented by the complementary MOS field effect transistors, and the structure of a typical complementary MOS field effect transistor is illustrated in FIG. 2 of the drawings. In FIG. 2, an n-type deep well 21 is formed in a p-type semiconductor substrate 22, and a p-channel MOS-type field effect transistor 23 and an n-channel MOS-type field effect transistor 24 are provided in the n-type well 21 and the p-type semiconductor substrate 22, respectively. Namely, the n-type well 21 is doped with p-type impurity atoms to form source/drain regions 25 and 26, and an oxide film 27 and a gate electrode 28 are stacked in succession on a channel region between the source/drain regions 25 and 26, thereby forming the p-channel MOS type field effect transistor 23. On the other hand, the p-type semiconductor substrate 22 is doped with n-type impurity atoms to form source/drain regions 29 and 30, and a oxide film 31 and a gate electrode 32 are stacked on a channel region between the source/drain regions 29 and 30 in a similar manner to the p-channel MOS type field effect transistor 23. The complementary MOS type field effect transistor thus arranged have the p-channel MOS type field effect transistor 23 and the n-channel MOS type field effect transistor 24 on the same semiconductor substrate 22 in close relationship to each other. Then, a wide isolating region 33 is needed along the boundary between the n-type deep well 21 and the p-type semiconductor substrate 22. The wide isolating region 33 consumes a real estate of the semiconductor substrate 22, so that a problem is encountered in that the memory cell array is hardly increased in memory cell density.

A lot of solutions have been proposed to overcome the problem encountered in the prior-art memory cell illustrated in FIG. 2. One of the solutions is disclosed in "A NEW FULL CMOS SRAM CELL STRUCTURE" in International Electron Device Meeting, 1984, pages 67 to 70. The memory cell structure described in the above paper is illustrated in FIG. 3 and fabricated on an n-type semiconductor substrate 36. The n-type semiconductor substrate 36 is doped with p-type impurity atoms to form a p-type well 37, and the p-type well 37 in turn is doped with n-type impurity atoms for formation of source/drain regions 38 and 39. Over that area between the source/drain regions 38 and 39 is stacked an oxide film 40 and a gate electrode 41 which form an n-channel MOS type field effect transistor 42 together with the source/drain regions 38 and 39. The semiconductor substrate 36 has a heavily doped n-type region 43 around the p-type well 37, and the heavily doped n-type region 43 is doped with p-type impurity atoms to form source/drain regions 44 and 45. An oxide film 46 and a gate electrode 47 are formed in succession over a channel region between the source/drain regions 44 and 45, and the source/drain regions 44 and 45, the oxide film 46 and the gate electrode 47 form in combination an n-channel type MOS field effect transistor 48. Thus, the n-channel MOS type field effect transistor 42 is located in adjacent to the p-channel MOS type field effect transistor 48, and, for this reason, a trench-shaped isolating region 49 is formed between the p-type well 37 and the n-type well 43. The trench shaped isolating region 49 occupies a small amount of real estate in comparison with the isolating region 33, so that the static type random access memory device can have the memory cells larger in number than that illustrated in FIG. 2 without reduction in transistor geometry.

However, another problem is encountered in the memory cell structure illustrated in FIG. 3 in that fluctuation in device characteristics tends to take place if the transistor geometry is reduced to increase the number of the memory cells. Namely, when the transistor geometry is reduced, the short channel effect is liable to take place in the component MOS type field effect transistors. As described in connection with FIG. 1, a data bit preserved in the memory cell is represented by the state of the complementary MOS type field effect transistor, i.e., either n-channel or p-channel transistor is turned on. Then, the short channel effect and, the fluctuation of the device characteristics are serious problems to reliability of data bits read out from the static random access memory device.

SUMMARY OF THE INVENTION

It is therefore an important object of the present invention to provide a structure of a complementary field effect transistor capable of reduction in geometry.

It is also another important object of the present invention to provide a structure of a complementary field effect transistor appropriate to a static type random access memory cell.

To accomplish these objects, the present invention proposes to form a complementary field effect transistor along side walls of a trench-type isolating region.

In accordance with one aspect of the present invention, there is provided a complementary field effect transistor fabricated in a semiconductor substrate of a first conductivity type, comprising, (a) a well formed in a surface portion of the semiconductor substrate and having a second conductivity type opposite to the first conductivity type, a groove being defined by a first side wall of the surface portion of the semiconductor substrate, a first bottom wall of the surface portion, a second side wall of the well and a second bottom wall of the well, (b) a first drain region of the second conductivity type formed in the semiconductor substrate and exposed to the first bottom wall, (c) a first source region of the second conductivity type formed in the surface portion and spaced apart from the first drain region, (d) a first gate insulating film formed on the first side wall, (e) a first gate electrode formed on the first gate insulating film and operative to cause a channel to take place between the first drain region and the first source region, the first drain region, the first source region, the first gate insulating film and the first gate electrode forming in combination a first MIS type field effect transistor, (f) a second drain region of the first conductivity type formed in the well and exposed to the second bottom wall, (g) a second source region of the first conductivity type formed in a surface portion of the well and spaced apart from the first drain region, (h) a second gate insulating film formed on the second side wall, (i) a second gate electrode formed on the second gate insulating film and operative to cause a channel to take place between the second drain region and the second source region, the second drain region, the second source region, the second gate insulating film and the second gate electrode forming in combination a second MIS type field effect transistor, (j) a conductive material provided in the groove and electrically interconnecting the first drain region and the second drain region to form the complementary field effect transistor, and (k) an insulating wall region formed between the first drain region and the second drain region. The first and second gate electrodes may be continuously formed by a hollow conductive member.

In accordance another aspect of the present invention, there is provided a flip-flop circuit fabricated in a semiconductor substrate of a first conductivity type comprising, (a) a well formed in a surface portion of the semiconductor substrate and having a second conductivity type opposite to the first conductivity type, a first groove being defined by a first side wall of the surface portion of the semiconductor substrate, a first bottom wall of the surface portion, a second side wall of the well and a second bottom wall of the well, a second groove being separated from the first groove and defined by a third side wall of the surface portion of the semiconductor substrate, a third bottom wall of the surface portion, a fourth side wall of the well and a fourth bottom wall of the well, (b) a first drain region of the second conductivity type formed in the semiconductor substrate and exposed to the first bottom wall, (c) a first source region of the second conductivity type formed in the surface portion and spaced apart from the first drain region, (d) a first gate insulating film formed on the first side wall, (e) a first gate electrode formed on the first gate insulating film and operative to cause a channel to take place between the first drain region and the first source region, the first drain region, the first source region, the first gate insulating film and the first gate electrode forming in combination a first MIS type field effect transistor, (f) a second drain region of the first conductivity type formed in the well and exposed to the second bottom wall, (g) a second source region of the first conductivity type formed in a surface portion of the well and spaced apart from the first drain region, (h) a second gate insulating film formed on the second side wall, (i) a second gate electrode formed on the second gate insulating film and operative to cause a channel to take place between the second drain region and the second source region, the second drain region, the second source region, the second gate insulating film and the second gate electrode forming in combination a second MIS type field effect transistor, (j) a first conductive material provided in the first groove and electrically interconnecting the first drain region and the second drain region to form a first complementary field effect transistor, (k) a third drain region of the second conductivity type formed in the semiconductor substrate and exposed to the third bottom wall, (l) a third source region of the second conductivity type formed in the surface portion and spaced apart from the third drain region, (m) a third gate insulating film formed on the third side wall, (n) a third gate electrode formed on the third gate insulating film and operative to cause a channel to take place between the third drain region and the third source region, the third drain region, the third source region, the third gate insulating film and the third gate electrode formed in combination a third MIS type field effect transistor, (o) a fourth drain region of the first conductivity type formed in the well and exposed to the fourth bottom wall, (p) a fourth source region of the first conductivity type formed in the surface portion of the well and spaced apart from the fourth drain region, (q) a fourth gate insulating film formed on the fourth side wall, (r) a fourth gate electrode formed on the fourth gate insulating film and operative to cause a channel to take place between the fourth drain region and the fourth source region, the fourth drain region, the fourth source region, the fourth gate insulating film and the fourth gate electrode forming in combination a fourth MIS type field effect transistor, (s) a second conductive material provided in the second groove and electrically interconnecting the third drain region and the fourth drain region to form a second complementary field effect transistor; and (t) an insulating wall region formed between the first and second drain regions and between the third and fourth drain regions, wherein the first conductive material is coupled to the third and fourth gate electrodes, and wherein the second conductive material is coupled to the first and second gate electrodes.

The flip-flop circuit may form a part of a static type random access memory cell. In this implementation, the first and second conductive material are respectively coupled to switching transistors which in turn are coupled to first and second bit lines, respectively. The first and second switching transistors are simultaneously gated by a word line.

BRIEF DESCRIPTION OF THE DRAWINGS

The features and advantages of a complementary field effect transistor according to the present invention will be more clearly understood from the following description taken in conjunction with the accompanying drawings in which.

DESCRIPTION OF THE PREFERRED EMBODIMENT

Figure 1:
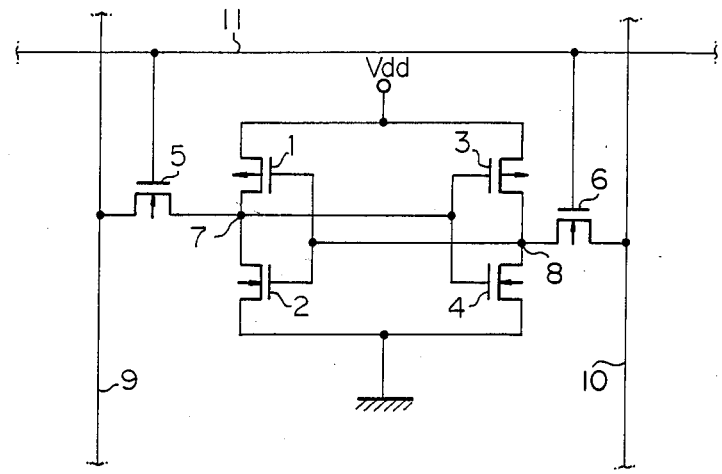
FIG. 1 is a circuit diagram showing the arrangement of a static random access memory cell to which the present invention appertains.
Figure 2:
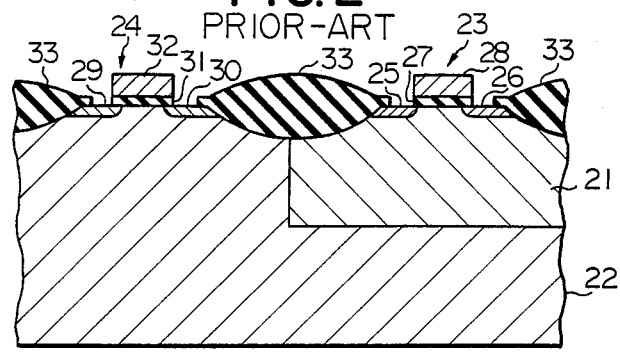
FIG. 2 is a cross-sectional view showing the structure of a typical complementary MOS type field effect transistor.
Figure 3:
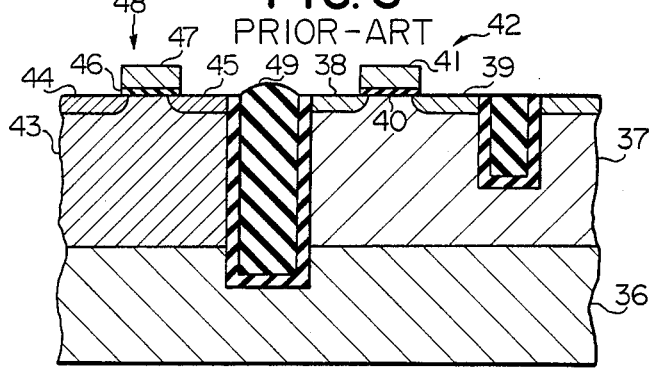
FIG. 3 is a cross-sectional view showing the structure of a complementary MOS type field effect transistor disclosed in International Electron Devices Meeting, 1984, pages 67 to 70.

Referring to FIGS. 4 to 7 of the drawings, there is shown the arrangement of a complementary MIS (metal-insulator-semiconductor) type field effect transistor forming part of a static random access memory cell of the type shown in FIG. 1. The complementary MIS type field effect transistor is fabricated on a semiconductor substrate 51 of, for example, single crystal silicon. The semiconductor substrate 51 is lightly doped with p-type impurity atoms and a field oxide 52 is grown in a surface portion of the semiconductor substrate 51 to define a transistor forming area. In the transistor forming area is formed an n-type well 53 which is surrounded by an insulating wall 72 of, for example, silicon dioxide. On the opposite sides of the n-type well 53 are formed first and second wide grooves 54 and 55 the former of which is defined by a first side wall of the semiconductor substrate 51, a first bottom wall of the semiconductor substrate 51, a second side wall of the n-type well 53, and a second bottom wall of the n-type well 53 and the other of which is defined by a third side wall of the semiconductor substrate 51, a third bottom wall of the semiconductor substrate 51, a fourth side wall of the n-type well 53, and a fourth bottom wall of the n-type well 53. The first, second, third and fourth side walls are covered with silicon dioxide films, respectively, and the silicon dioxide films provide first, second, third and fourth gate insulating films 56, 57, 58 and 59 of first, second, third and fourth MIS type field effect transistors 60, 61, 62 and 63, respectively. On the first to fourth gate insulating films 56 to 59 are formed first, second, third and fourth gate electrodes 64, 65, 66 and 67 of the first, second, third and fourth MIS type field effect transistors 60 to 63 which are covered with respective insulating films of silicon dioxide. The first and second gate electrodes 64 and 65 are constituted by a single conductive hollow member of polycrystalline silicon formed on the first and second gate insulating films 56 and 57 and on portions of the insulating wall 72 between the gate insulating films 56 and 57. Also, the third and fourth gate electrodes 66 and 67 are constituted by a single conductive hollow member of polycrystalline silicon formed on the third and fourth gate insulating films 58 and 59 and on portions of the insulating wall 72 between the gate insulating films 58 and 59. In the semiconductor substrate 51 is formed heavily doped n-type impurity regions which are exposed to the first and third bottom walls and serve as first and third drain regions 68 and 69 of the first and third MIS type field effect transistors 60 and 62, respectively. Similarly, heavily doped p-type impurity regions are formed in the n-type well 53, and the p-type impurity regions are exposed to the second and fourth bottom walls of the n-type well 53 and serve as second and fourth drain regions 70 and 71 of the second and fourth MIS type field effect transistors 61 and 63, respectively. In the deep semiconductor substrate 51 are formed the insulating wall 72 which extends in the semiconductor substrate 51 and partitions the first and third drain regions 68 and 69 from the second and fourth drain regions 70 and 71, respectively. A first refractory metal layer 73 is formed in the first wide groove 54 and is electrically connected to the first and second drain regions 68 and 70. The first refractory metal layer 73 extends on a silicon dioxide film 74 and electrically connected to the third and fourth gate electrodes 66 and 67 through contact holes (which are not shown). In a similar manner, a second refractory metal layer 75 is formed in the second wide groove 55 and is electrically connected to the third and fourth drain regions 69 and 71. The second refractory metal layer 75 extends on the silicon dioxide film 74 and is electrically connected to the first and second gate electrodes 64 and 65. The first and second refractory metal layers 73 and 75 thus arranged not only interconnect the third and fourth gate electrodes 66 and 67 and the first and second gate electrodes 64 and 65, respectively, but also provide cross-coupled conduction paths to form a flip-flop circuit. The two conductive hollow members are covered with respective insulating films IN1 and IN2, respectively. Then, the first and second refractory metals 73 and 75 are electrically isolated from the first and second gate electrodes 64 and 65 and the third and fourth gate electrodes 66 and 67, respectively.

In a surface portion of the semiconductor substrate 51 are formed heavily doped n-type impurity regions which serve as first and third source regions 76 and 77 of the first and third MIS type field effect transistors 60 and 62, respectively. The first and third source regions 76 and 77 are coupled to a ground line GND. The first gate insulating film 56, the first gate electrode 64, the first drain region 68 and the first source region 76 form in combination the n-channel type MIS field effect transistor 60, and the third gate insulating film 58, the third gate electrode 66, the third drain region 69 and the third source region 77 also form in combination the n-channel MIS type field effect transistor 62. On the other hand, in a surface portion of the n-type well 53 is formed heavily doped p-type impurity regions which is separated from each other by a heavily doped n-type impurity region and serve as second and fourth source regions 78 and 79, respectively. The second and fourth source regions 78 and 79 are connected to a positive voltage line Vdd. The second gate insulating film 57, the second gate electrode 65, the second drain region 70 and the second source region 78 form in combination the second MIS type field effect transistor 61, and, similarly, the fourth gate insulating film 59, the fourth gate electrode 67, the fourth drain region 71 and the fourth source region 79 form in combination the p-channel MIS type field effect transistor 63.

Figure 4:
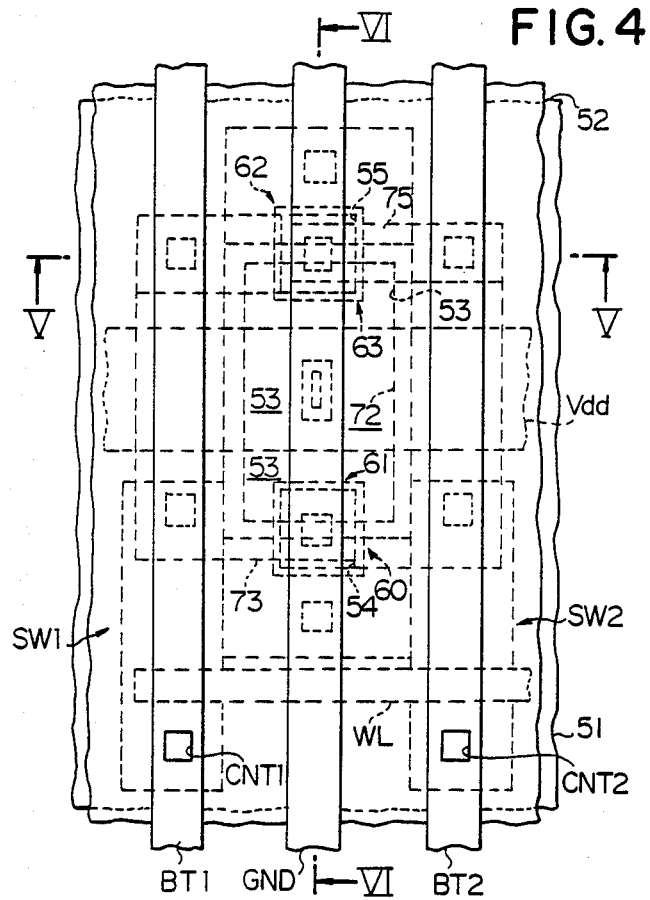
FIG. 4 is a plan view showing the arrangement of a complementary field effect transistor embodying the present invention.

As will be better seen from FIG. 4, two switching transistors SW1 and SW2 are formed on the semiconductor substrate 51, and the switching transistors SW1 and SW2 have an n-channel MIS type structure. A word line WL extends over those areas between n-type source/drain regions, then the switching transistors SW1 and SW2 are simultaneously shifted between on states and off states depending upon a voltage level on the word line WL. The switching transistors SW1 and SW2 and the flip-flop circuit form in combination a static type random access memory cell which is operative to preserve a data bit.

In order to access the data bit, first and second bit lines BT1 and BT2 are provided on an insulating layer covering the structure of the static type random access memory cell. The first bit line BT1 is coupled to the first switching transistor SW1 through a contact window CNT1 and the second bit line BT2 is coupled to the second switching transistor SW2 through a contact window CNT2, so that the first and second bit lines BT1 and BT2 are electrically connected to the first and second refractory metal layers 73 and 75 through the first and second switching transistors SW1 and SW2, respectively, upon application of an active high voltage level on the word line WL.

Figure 5:
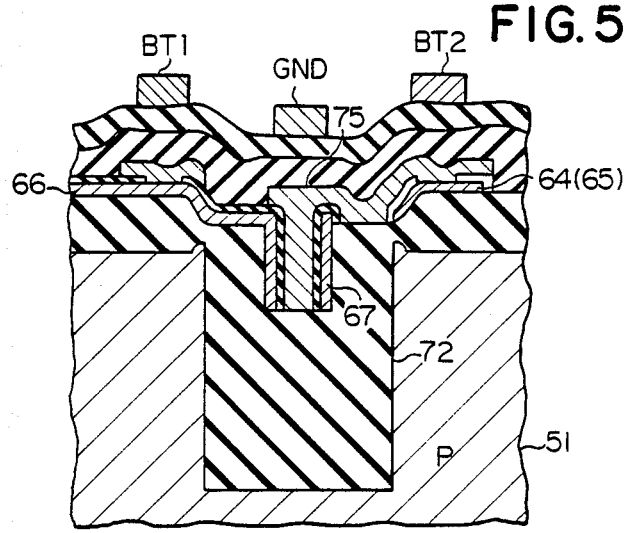
FIG. 5 is a cross-sectional view taken along the line V—V of FIG. 4, and showing the structure of the complementary field effect transistor.
Figure 6:
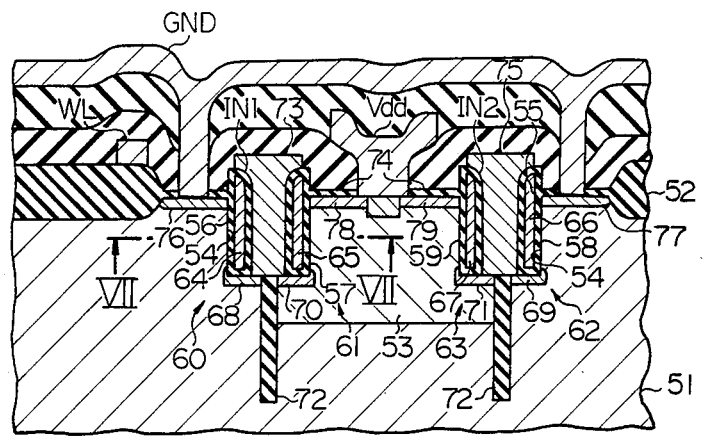
FIG. 6 is a cross-sectional view taken along the line VI—VI of FIG. 4, and showing the structure of the complementary field effect transistor.
Figure 7:
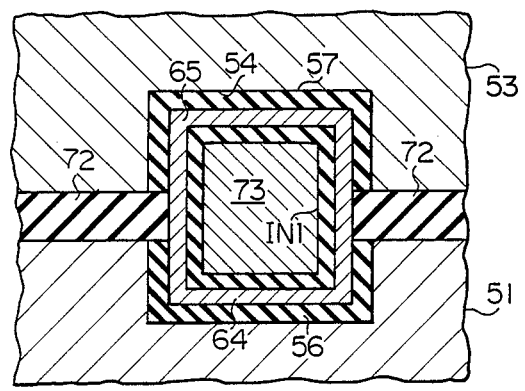
FIG. 7 is a view taken along the line VII—VII of FIG. 6, and showing, in enlarged scale, the complementary field effect transistor illustrated in FIG. 4.
Figure 8A:
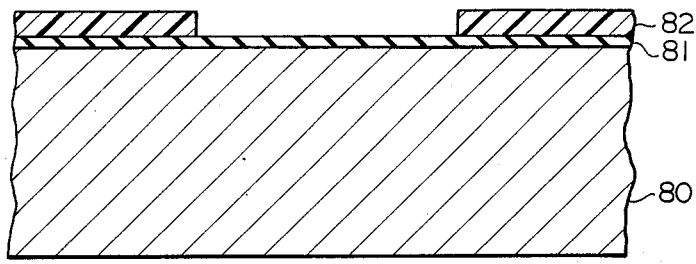
FIGS. 8A to 8N are cross sectional views showing the structures of the complementary field effect transistor in different steps, respectively.
Figure 8B:
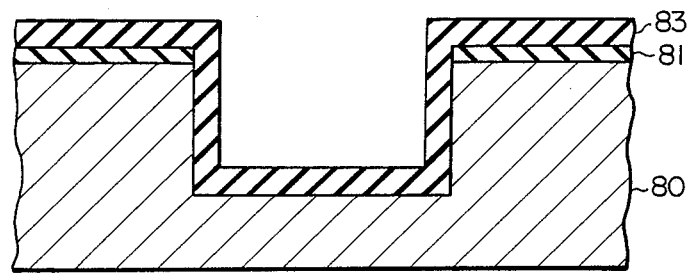

Description will be made for a fabrication process for the structure of the complementary MIS field effect transistor illustrated in FIGS. 4 to 6 with reference to FIGS. 8A to 8N. The starting material is a p-type lightly doped single-crystal silicon wafer serving as a substrate 80, and a silicon dioxide film 81 is thermally grown on the surface of the silicon substrate 80. Subsequently, a photo-resist film is applied to the entire surface of the silicon dioxide film 81, and, then, the photo-resist film is selectively removed to form a photo-mask 82 which defines a cavity forming area. The resultant structure is shown in FIG. 8A.

Next, a large cavity 83 is formed by reactive ion etching techniques. Namely, the silicon substrate 80 covered with the silicon dioxide film 81 is placed in an etching reactor (not shown), and the silicon dioxide film 81 exposed to an appropriate etching gaseous mixture is selectively removed, then removing the surface portion of the silicon substrate 80 by using an appropriate etching gaseous mixture for single crystal silicon. These anisotropic dry etching processes result in a large cavity formed in the cavity forming area. After formation of the large cavity, the photo mask 82 is stripped off, and, thereafter, silicon dioxide is deposited on the entire surface to a thickness ranging between about 1 micron to about 2 microns. Then, the silicon dioxide film 81 and side and bottom walls defining the cavity 83 are covered with a silicon dioxide film 83 as shown in FIG. 8B.

The silicon substrate 80 covered with the silicon dioxide film 83 is placed in the etching reactor again and, then, exposed to the ion bombardment, so that the silicon dioxide film 83 is partially removed except for that 83a covering the side wall of the silicon substrate 80. Next, the cavity is filled with a p-type single crystal silicon 84 by using a selective epitaxial growth technique, and a silicon dioxide film 85 is thermally grown on the entire surface of the p-type silicon substrate 80 and the p-type single crystal silicon block 84. The resultant structure is shown in FIG. 8C.

Figure 8C:
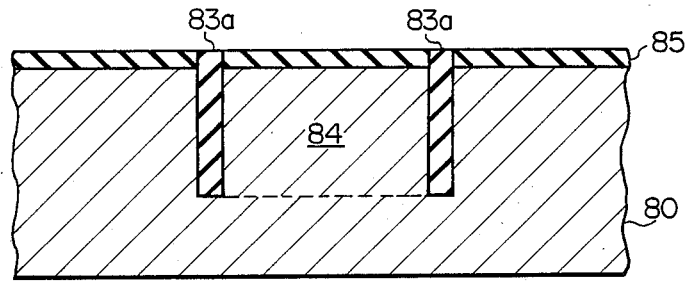
Figure 8D:
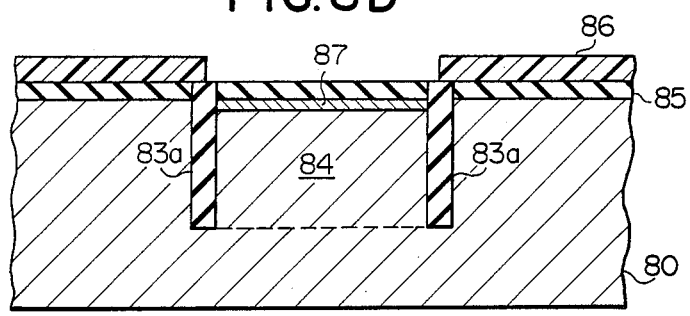

A photo-resist material is applied to the entire surface of the resultant structure shown in FIG. 8C and the photo-resist material is selectively removed to form a photo mask 86 which exposes a portion of the silicon dioxide film 81 over the p-type single crystal silicon block 84. When the photo mask 86 is formed on the silicon dioxide film 85, n-type impurity atoms are implanted into the surface portion of the p-type single crystal silicon block 84 by an ion implantation technique to form an n-type impurity region 87 heavily doped with the n-type impurity atoms. The resultant structure is shown in FIG. 8D.

Figure 8E:
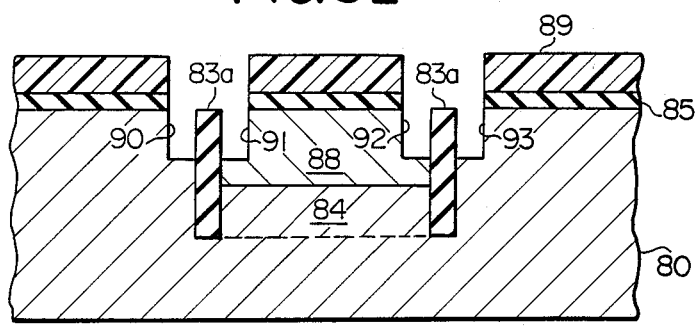

After formation of the heavily doped n-type impurity region 87, the photo mask 86 is stripped off, then the silicon substrate 80 is placed in a high temperature ambient. During the heat treatment, the n-type impurity atoms are driven into the p-type single crystal silicon block 84, so that an n-type well 88 is formed in the p-type single crystal silicon block 84. A photo-resist material is applied to the entire surface and the photo-resist material is selectively removed and patterned to form a photo mask 89 which exposes a part of the silicon dioxide film 85 over that area around the silicon dioxide film 83a. Using the photo mask 89, a reactive ion etching is applied to the silicon dioxide film 85 to partially expose the surface portion of the silicon substrate 80 and the n-type well 88, and, thereafter, the exposed surface portion of the silicon substrate 80 is selectively removed by a reactive ion etching technique to form two pairs of narrow grooves 90, 91, 92 and 93. During the reactive etching process applied to the silicon substrate 80 and the n-type well 88, the silicon dioxide film 83a is not affected by the etching gaseous mixture, so that the silicon dioxide film 83a is projected from the boundary between the silicon substrate 80 and the n-type well 88 so as to separate the narrow grooves 90 and 92 from the narrow grooves 91 and 93, respectively. The narrow grooves 90 and 93 are defied by a side wall of the silicon substrate 80, a bottom wall of the silicon substrate 80 and the silicon dioxide film 83a, and the narrow grooves 91 and 92 are defined by a side wall of the n-type well 88, a bottom wall of the n-type well 88 and the silicon dioxide film 83a. The resultant structure is illustrated in FIG. 8E. As will be seen from FIG. 8E, each of the narrow grooves 90 to 93 is smaller in depth than the n-type well 88.

Figure 8F:
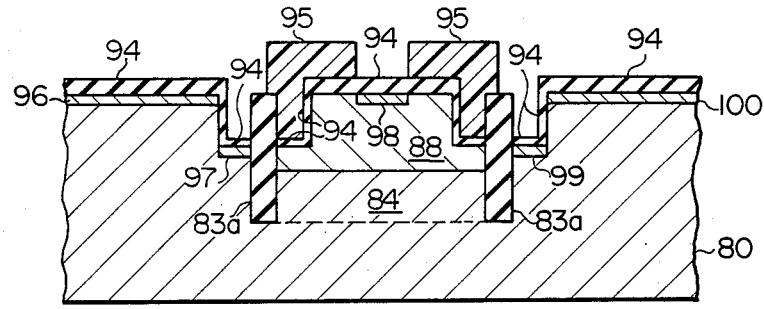

After the photo mask 89 is stripped off, the silicon substrate 80 is placed in a high temperature ambient, then a thin silicon dioxide film 94 is thermally grown on the side wall of the silicon substrate 80, the bottom wall of the silicon substrate 80, the side wall of the n-type well 88 and the bottom wall of the n-type well 88. Subsequently, a photo-resist material is provided on the entire surface of the silicon dioxide film 94, and the photo-resist material is selectively removed from the silicon dioxide film 94 covering the side and bottom walls of the silicon substrate 80, the surface portion of the silicon substrate 80 and a central surface portion of the n-type well 88. Then, the photo-resist material remains on the silicon dioxide film covering the side and bottom walls of the n-type well 88 and a peripheral surface portion of the n-type well 88, and this remaining photo-resist material serves as a photo mask 95 for the subsequent ion implantation process. Using the photo mask 95, n-type impurity atoms are implanted into the surface portion and the bottom wall portion of the silicon substrate 80, then n-type impurity regions 96, 97, 98, 99 and 100 are formed in the surface portion and the bottom wall portion, respectively, but these n-type impurity regions 96 to 100 are electrically separated from one another. The n-type impurity regions 96 and 100 serves as source regions of two n-channel MIS type field effect transistors, respectively, and the n-type impurity regions 97 and 99 provide drain regions of the two n-channel MIS type field effect transistors, respectively. The resultant structure is shown in FIG. 8F.

Figure 8G:
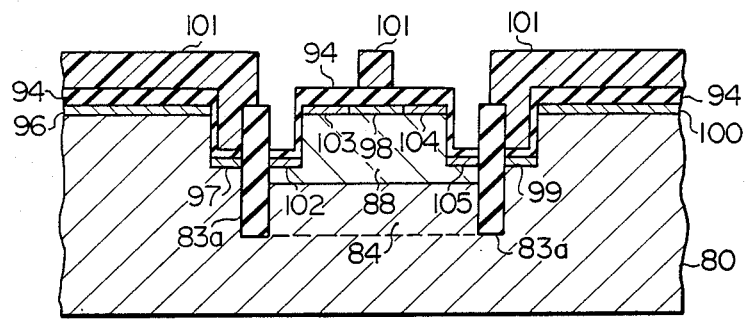
Figure 8H:
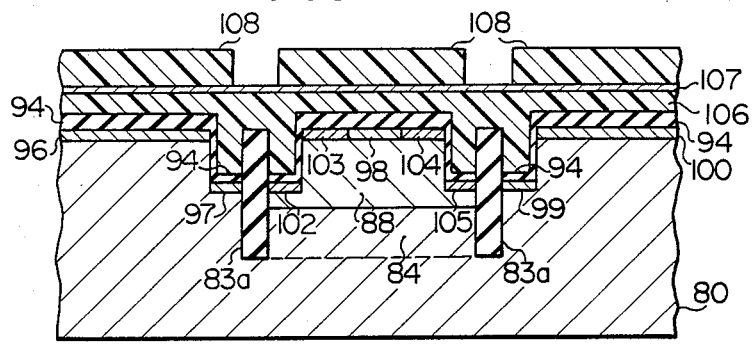

Formation of source/drain regions of two p-channel MIS type field effect transistors follows. Firstly, the photo mask 95 is stripped off, and a photo-resist material is applied to the entire surface again. The photo-resist material is selectively removed to inversely expose the silicon dioxide film 94. Then, the silicon dioxide film 94 covering the side and bottom walls of the n-type well 88 and the peripheral surface portion of the n-type well 88 are exposed, however the remaining silicon dioxide film 94 is covered with the photo-resist material. Then, p-type impurity atoms are implanted into the bottom wall portion and the peripheral surface portion of the n-type well 88 using the photo-resist material as a mask 101. Then, heavily doped p-type impurity regions 102, 103, 104 and 105 are formed in the bottom wall portion and the peripheral surface portion. The p-type impurity regions 103 and 104 serve as source regions of the p-channel MIS type field effect transistors, respectively, and, on the other hand, the p-type impurity regions 102 and 105 provide drain regions of the p-channel MIS type field effect transistors, respectively. The resultant structure of this stage is shown in FIG. 8G.

Figure 8I:
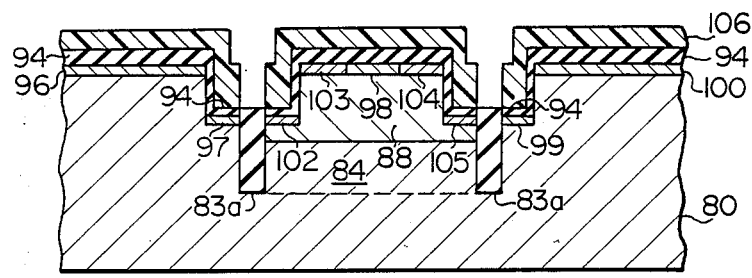

The mask 101 is removed after completion of forming the p-type impurity regions 102 to 105, and a photo-resist material 106 is provided on the entire surface of the structure by using, for example, a spin coating technique, then a flat surface is obtained. The flat surface of the photo-resist material 106 is coated with an insulating film 107 such as, for example, a silica film, and a photo-resist material is formed on the insulating film 107. The photo-resist material is patterned to form a photo mask 108, and the photo mask 108 exposes the insulating film 107 covering those areas of the photo-resist material 106 slightly narrower than the total areas of the narrow grooves 90 to 93 and the silicon dioxide film 83a. The silicon substrate 80 is placed in the etching reactor and the exposed insulating film 107 is removed by the ion bombardments during the reactive etching process to form a mask layer. After formation of the mask layer, the photo-mask 108 is stripped off to expose the mask layer, and, thereafter, the photo-resist material 106 is selectively removed by using the mask layer of the insulating material until the top surface of the silicon dioxide film 83a is exposed. The top surface of the silicon dioxide film 83a is thus exposed, the reactive etching technique is applied to the resultant structure, then the silicon dioxide film 83a projecting from the silicon dioxide film 94 is etched away by using the mask layer of the photo-resist material 106. The resultant structure is shown in FIG. 8I.

Figure 8J:
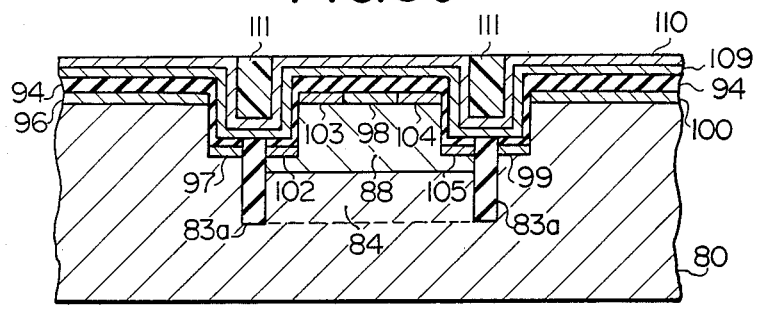

Subsequently, the mask layer of the photo-resist material 106 is stripped off from the silicon dioxide film 94, so that wide grooves remain in the silicon dioxide film 94. A low resistive polysilicon film 109 having a high impurity concentration of n-type or p-type and a high resistive polysilicon film 110 are topographically formed in succession on the silicon dioxide film 94, and this results in shape transfer from narrow grooves 90 to 93, so that slightly narrow grooves are formed in the high resistive polysilicon film 110. On the entire surface of the silicon dioxide film 94 is spin coated a photo-resist material 111 to a thickness sufficient to fill the slightly narrow grooves. This results in a smooth surface of the photo-resist material 111. The photo-resist material 111 is uniformly etched away by the reactive etching technique until the high-resistive polysilicon film 110 appears, so that the photo-resist material 111 remains in the slightly narrow grooves. Then, n-type impurity atoms are heavily implanted in the high-resistive polysilicon film 110 using the photo-resist material as a mask. The resultant structure of this stage is shown in FIG. 8J.

Figure 8K:
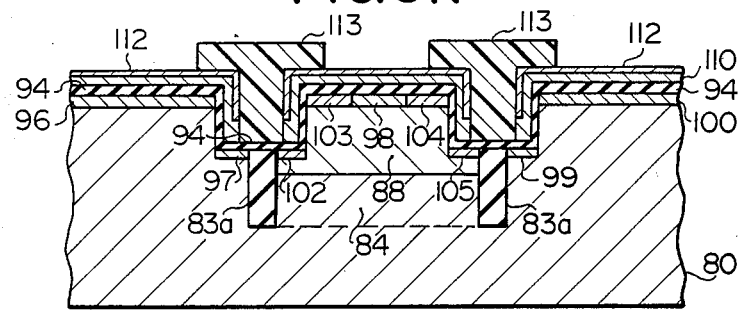

Next, the photo-resist material 111 in the slightly narrow grooves are removed, and the silicon substrate 80 is placed in a high temperature ambient. During this heat treatment process, a silicon dioxide film is thermally grown on the polysilicon film 110. In general, the oxidation rate is proportional to the impurity concentration, so that the silicon oxide film 112 on the bottom of the slightly narrow grooves is smaller in thickness than the remaining silicon dioxide film 112. The reactive etching technique is applied to the silicon dioxide film 112, so that the silicon dioxide film 112 is uniformly removed until the polysilicon film 110 appears in the bottom of the slightly narrow grooves. However, the silicon dioxide film 112 remains on the polysilicon film 110 except for the bottom of the slightly narrow grooves. Using the silicon dioxide film 112 as a mask, the polysilicon film 110 is removed by the reactive etching technique until the silicon dioxide film 94 is exposed to the bottom of the slightly narrow grooves. Subsequently, a photo-resist material is provided on the entire surface with a thickness sufficient to fill the slightly narrow grooves, then the photo-resist material is patterned to form a mask layer 113 which defines gate electrodes of the n-channel MIS type field effect transistors and gate electrodes of the p-channel MIS type field effect transistors as shown in FIG. 8K.

Figure 8L:
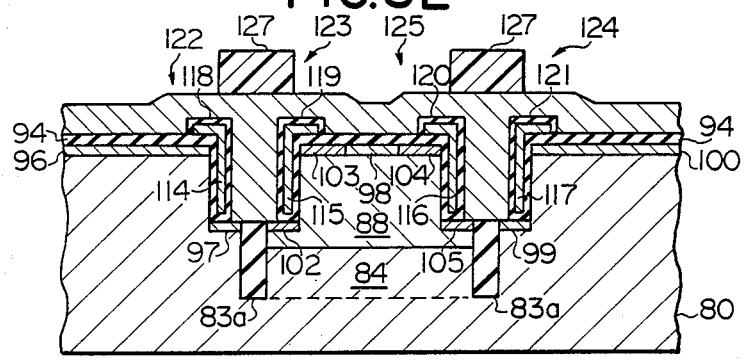

After formation of the mask layer 113, the silicon dioxide film 112 and the polysilicon films 109 and 110 are etched and patterned to form gate electrodes 114, 115, 116 and 117 of the MIS type field effect transistors by using the reactive etching technique. Subsequently, the mask layer 113 is removed from the slightly narrow grooves, and, then, the silicon substrate 80 is placed in a high temperature ambient to thermally form a silicon dioxide films 118, 119, 120 and 121 on the polysilicon gate electrodes 114 to 117. In this way, the n-channel MIS type field effect transistor 122 and the p-channel MIS type field effect transistor 123 are vertically formed along the side walls defining the wide groove formed from the narrow grooves 90 and 91, and the n-channel MIS type field effect transistor 124 and the p-channel MIS type field effect transistor 125 are similarly formed along the side walls defining the wide groove formed from the narrow grooves 92 and 93. Though not shown in the drawings, a contact hole is formed in each of the silicon dioxide films 118 to 121 on the top surface of each gate electrode 114, 115, 116 or 117. Subsequent step is formation of metal wiring layers. Namely, the silicon dioxide film 94 placed in the bottoms of the wide grooves are selectively etched away by using the reactive etching technique, and a refractory metal layer 126 of, for example, molybdenum or tungsten is deposited on the entire surface by using a CVD (chemical-vapor-deposition) technique. On the refractory metal layer 126 is spin-coated a photo resist material which is patterned to form a mask layer 127 as shown in FIG. 8L.

Figure 8M:
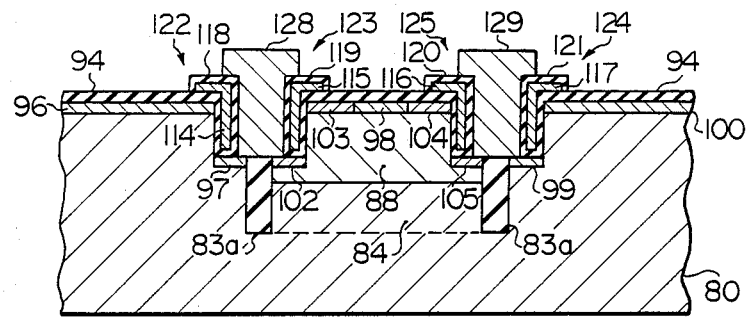
Figure 8N:
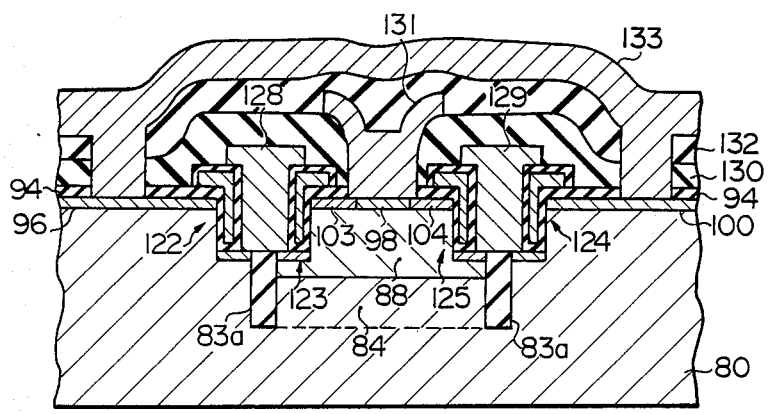

With the mask layer 127, the refractory metal layer is selectively removed to form metal wiring layers 128 and 129 which respectively provide conduction paths between the n-channel MIS type field effect transistor 122 and the p-channel MIS type field effect transistor 123 and between the n-channel MIS type field effect transistor 124 and the p-channel MIS type field effect transistor 125 as shown in FIG. 8M.

When the metal wiring layers 128 and 129 are formed, a thick silicon dioxide layer 130 is deposited on the entire surface by using a CVD technique, and, then, the silicon dioxide films are selectively removed by using appropriate lithographic techniques to form a contact hole exposing the p-type impurity regions 103 and 104 and the n-type impurity region 98. A metal layer of, for example, aluminum is deposited on the entire surface and, then, etched and patterned by using appropriate lithographic techniques to form a metal layer 131 which interconnects a source of positive voltage Vdd and the impurity regions 98, 103 and 104. The CVD technique is applied to the entire surface to form a silicon dioxide layer 132. The silicon dioxide layers 132, 130 and 94 are selectively removed by using the lithographic techniques to form contact holes exposing the n-type impurity regions 96 and 100, respectively. On the entire surface is deposited a metal layer of, for example, aluminum which is etched and patterned by using the lithographic techniques to form a metal layer 133, and the metal layer 133 supplies the ground voltage level to the n-type impurity regions 96 and 100, respectively. The resultant structure is shown in FIG. 8N. Thus, the four MIS type field effect transistors 122 to 125 are arranged to form two complementary MIS type field effect transistors one of which consists of the n-channel MIS type field effect transistor 122 and the p-channel MIS type field effect transistor 123 and the other of which consists of the n-channel MIS type field effect transistor 124 and the p-channel MIS type field effect transistor 125. These two complementary MIS type field effect transistors form a static type random access memory cell together with two switching transistors (not shown) which are fabricated on the same silicon substrate 80. Though not shown in the drawings, the structure shown in FIG. 8N is covered with a passivation film for protection of the MIS type transistors.

Although particular embodiment of the present invention have been shown and described, it will be obvious to those skilled in the art that various changes and modifications may be made without departing from the spirit and scope of the present invention.

What is claimed is:

1. A complementary field effect transistor fabricated in a semiconductor substrate of a first conductivity type, comprising:
   (a) a well formed in a surface portion of said semiconductor substrate and having a second conductivity type opposite to said first conductivity type, a groove being defined by a first side wall of the surface portion of said semiconductor substrate, a first bottom wall of the surface portion, a second side wall of said well and a second bottom wall of the well, said groove having a rectangular cross section;
   (b) a first drain region of said second conductivity type formed in said semiconductor substrate and exposed to said first bottom wall;
   (c) a first source region of said second conductivity type formed in said surface portion and spaced apart from said first drain region;
   (d) a first gate insulating film formed on said first side wall;
   (e) a first gate electrode formed on said first gate insulating film and operative to cause a channel to take place between said first drain region and said first source region, said first drain region, said first source region, said first gate insulating film and said first gate electrode forming in combination a first MIS type field effect transistor;
   (f) a second drain region of said first conductivity type formed in said well and exposed to said second bottom wall;
   (g) a second source region of said first conductivity type formed in a surface portion of said well and spaced apart from said first drain region;
   (h) a second gate insulating film formed on said second side wall;
   (i) a second gate electrode formed on said second gate insulating film and operative to cause a channel to take place between said second drain region and said second source region, said first and second gate electrodes being formed in a ring shaped conductive material, and said second drain region, said second source region, said second gate insulating film and second gate electrode forming in combination a second MIS type field effect transistor;
   (j) a conductive material provided in said groove and contacting with said first and second drain regions for electrically interconnecting said first drain region and said second drain region, thereby forming said complementary field effect transistor; and
   (k) an insulating wall region formed between said first drain region and said second drain region and having a rectangular cross section.

2. A complementary field effect transistor as set forth in claim 1, in which said first source region is electrically connected to a first constant voltage source.

3. A complementary field effect transistor as set forth in claim 1, in which said second source region is electrically connected to a second constant voltage source.

4. A complementary field effect transistor as set forth in claim 1, in which said semiconductor substrate is formed of single crystal silicon.

5. A complementary field effect transistor as set forth in claim 1, in which said first and second gate electrodes are formed of polycrystalline silicon.

6. A complementary field effect transistor as set forth in claim 1, in which said first and second gate insulating films are formed of silicon dioxide.

7. A complementary field effect transistor as set forth in claim 1, in which said insulating wall region is formed of silicon dioxide.

8. A complementary field effect transistor as set forth in claim 1, in which said insulating wall region has a bottom portion deeper than a bottom portion of said well.

9. A complementary field effect transistor as set forth in claim 1, in which said first and second gate electrodes are formed by a single conductive hollow member.

10. A flip-flop circuit fabricated in a semiconductor substrate of a first conductivity type, comprising:
  (a) a well formed in a surface portion of said semiconductor substrate and having a second conductivity type opposite to said first conductivity type, a first groove being defined by a first side wall of the surface portion of said semiconductor substrate, a first bottom wall of the surface portion, a second side wall of said well and a second bottom wall of the well, a second groove being separated from said first groove and defined by a third side wall of the surface portion of said semiconductor substrate, a third bottom wall of the surface portion, a fourth side wall of said well and a fourth bottom wall of the well, said first and second grooves each having a rectangular cross section;
  (b) a first drain region of said second conductivity type formed in said semiconductor substrate and exposed to said first bottom wall;
  (c) a first source region of said second conductivity type formed in said surface portion and spaced apart from said first drain region;
  (d) a first gate insulating film formed on said first side wall;
  (e) a first gate electrode formed on said first gate insulating film and operative to cause a channel to take place between said first drain region and said first source region, said first drain region, said first source region, said first gate insulating film and said first gate electrode forming in combination a first MIS type field effect transistor;
  (f) a second drain region of said first conductivity type formed in said well and exposed to said second bottom wall;
  (g) a second source region of said first conductivity type formed in a surface portion of said well and spaced apart from said first drain region;
  (h) a second gate insulating film formed on said second side wall;
  (i) a second gate electrode formed on said second gate insulating film and operative to cause a channel to take place between said second drain region and said second source region, said first and second gate electrodes being formed in a ring shaped conductive material, said second drain region, said second source region, said second gate insulating film and said second gate electrode forming in combination a second MIS type field effect transistor;
  (j) a first conductive material provided in said first groove and electrically interconnecting said first drain region and said second drain region to form a first complementary field effect transistor;
  (k) a third drain region of said second conductivity type formed in said semiconductor substrate and exposed to said third bottom wall;
  (l) a third source region of said second conductivity type formed in said surface portion and spaced apart from said third drain region;
  (m) a third gate insulating film formed on said third side wall;
  (n) a third gate electrode formed on said third gate insulating film and operative to cause a channel to take place between said third drain region and said third source region, said third drain region, said third source region, said third gate insulating film and said third gate electrode forming in combination a third MIS type field effect transistor;
  (o) a fourth drain region of said first conductivity type formed in said well and exposed to said fourth bottom wall;
  (p) a fourth source region of said first conductivity type formed in the surface portion of said well and spaced apart from said fourth drain region;
  (q) a fourth gate insulating film formed on said fourth side wall;
  (r) a fourth gate electrode formed on said fourth gate insulating film and operative to cause a channel to take place between said fourth drain region and said fourth source region, said third and fourth gate electrodes being formed in a ring shaped conductive material, said fourth drain region, said fourth source region, said fourth gate insulating film and said fourth gate electrode forming in combination a fourth MIS type field effect transistor;
  (s) a second conductive material provided in said second groove and electrically interconnecting said third drain region and said fourth drain region to form a second complementary field effect transistor; and
  (t) an insulating wall region formed between said first and second drain regions and between said third and fourth drain regions, wherein said first conductive material is coupled to said third and fourth gate electrodes, and wherein said second conductive material is coupled to said first and second gate electrodes.

11. A static type random access memory cell fabricated on a semiconductor substrate of a first conductivity type, comprising:
  (a) a well formed in a surface portion of said semiconductor substrate and having a second conductivity type opposite to said first conductivity type, a first groove being defined by a first side wall of the surface portion of said semiconductor substrate, a first bottom wall of the surface portion, a second side wall of said well and a second bottom wall of the well, a second groove being separated from said first groove and defined by a third side wall of the surface portion of said semiconductor substrate, a third bottom wall of the surface portion, a fourth side wall of said well and a fourth bottom wall of the well, said first and second grooves each having a rectangular cross section;
  (b) a first drain region of said second conductivity type formed in said semiconductor substrate and exposed to said first bottom wall;
  (c) a first source region of said second conductivity type formed in said surface portion and spaced apart from said first drain region;
  (d) a first gate insulating film formed on said first side wall;
  (e) a first gate electrode formed on said first gate insulating film and operative to cause a channel to take place between said first drain region and said first source region, said first drain region, said first source region, said first gate insulating film and said first gate electrode forming in combination a first MIS type field effect transistor;

(f) a second drain region of said first conductivity type formed in said well and exposed to said second bottom wall;

(g) a second source region of said first conductivity type formed in a surface portion of said well and spaced apart from said first drain region;

(h) a second gate insulating film formed on said second side wall;

(i) a second gate electrode formed on said second gate insulating film and operative to cause a channel to take place between said second drain region and said second source region, said first and second gate electrode being formed into ring shaped conductive material, said second drain region, said second source region, said second gate insulating film and said second gate electrode forming in combination a second MIS type field effect transistor;

(j) a first conductive material provided in said first groove and electrically interconnecting said first drain region and said second drain region to form a first complementary field effect transistor;

(k) a third drain region of said second conductivity type formed in said semiconductor substrate and exposed to said third bottom wall;

(l) a third source region of said second conductivity type formed in said surface portion and spaced apart from said third drain region;

(m) a third gate insulating film formed on said third side wall;

(n) a third gate electrode formed on said third gate insulating film and operative to cause a channel to take place between said third drain region and said third source region, said third drain region, said third source region, said third gate insulating film and said third gate electrode forming in combination a third MIS type field effect transistor;

(o) a fourth drain region of said first conductivity type formed in said well and exposed to said fourth bottom wall;

(p) a fourth source region of said first conductivity type formed in the surface portion of said well and spaced apart from said fourth drain region;

(q) a fourth gate insulating film formed on said fourth side wall;

(r) a fourth gate electrode formed on said fourth gate insulating film and operative to cause a channel to take place between said fourth drain region and said fourth source region, said third and fourth gate electrodes being formed in a ring shaped conductive material, said fourth drain region, said fourth source region, said fourth gate insulating film and said fourth gate electrode forming in combination a fourth MIS type field effect transistor;

(s) a second conductive material provided in said second groove and electrically interconnecting said third drain region and said fourth drain region to form a second complementary field effect transistor, said first and second conductive material being coupled to said third and fourth gate electrodes and to said first and second gate electrodes, respectively to form a flip-flop circuit;

(t) an insulating wall region formed between said first and second drain regions and between said third and fourth drain regions;

(u) a first switching transistor having a first control gate coupled to a word line and capable of providing a conduction path between a first bit line and said first conductive material; and (v) a second switching transistor having a second control gate coupled to said word line and capable of providing a conduction path between a second bit line and said second conductive material.

* * * * *

UNITED STATES PATENT AND TRADEMARK OFFICE
CERTIFICATE OF CORRECTION

PATENT NO. : 4,920,397
DATED : April 24, 1990
INVENTOR(S) : Toshiyuki ISHIJIMA

It is certified that error appears in the above-identified patent and that said Letters Patent is hereby corrected as shown below:

Col. 1, line 18, delete "MO" and insert --MOS--.

Signed and Sealed this

Sixteenth Day of July, 1991

Attest:

HARRY F. MANBECK, JR.

*Attesting Officer*     *Commissioner of Patents and Trademarks*